(12) United States Patent
Yang et al.

(10) Patent No.: US 12,040,345 B2
(45) Date of Patent: Jul. 16, 2024

(54) LIGHT EMITTING SUBSTRATE, WIRING SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhichao Yang, Beijing (CN); Jian Wang, Beijing (CN); Yong Zhang, Beijing (CN); Yingzi Wang, Beijing (CN); Feng Qu, Beijing (CN); Xianglei Qin, Beijing (CN); Jian Lin, Beijing (CN); Limin Zhang, Beijing (CN); Zepeng Sun, Beijing (CN); Liangzhen Tang, Beijing (CN); Zhilong Duan, Beijing (CN); Honggui Jin, Beijing (CN); Yashuai An, Beijing (CN); Lingfang Nie, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 551 days.

(21) Appl. No.: 17/281,293

(22) PCT Filed: Jan. 21, 2020

(86) PCT No.: PCT/CN2020/073634
§ 371 (c)(1),
(2) Date: Mar. 30, 2021

(87) PCT Pub. No.: WO2021/146958
PCT Pub. Date: Jul. 29, 2021

(65) Prior Publication Data
US 2022/0123043 A1    Apr. 21, 2022

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ............. H01L 25/0753; H01L 27/1214; H01L 27/156; H01L 33/52; H01L 33/58;
(Continued)

(56) References Cited

U.S. PATENT DOCUMENTS 8,933,433 B2    1/2015   Higginson et al.
10,163,791 B2 *  12/2018  Akiba ................. H01L 23/5386
(Continued)

FOREIGN PATENT DOCUMENTS

CN    102606908 A    7/2012
CN    205191244 U    4/2016
(Continued)

OTHER PUBLICATIONS

Extended European Search Report from European Patent Application No. 20873353.5 dated Feb. 21, 2023.
(Continued)

*Primary Examiner* — Thao P Le
(74) *Attorney, Agent, or Firm* — Dilworth & Barrese, LLP.; Michael J. Musella, Esq.

(57) ABSTRACT

A light emitting substrate, a wiring substrate and a display device are provided. The light emitting substrate includes light emitting units and a first electrode wire. The first electrode wire includes a first wire and a second wire. The light emitting units include first light emitting units and second light emitting units, a position of each first light emitting unit is a first light emitting unit region, a position of each second light emitting unit is is a second light
(Continued)

emitting unit region, the first wire is connected with the first light emitting unit, passes through the first light emitting unit region and is located at an outer side of the second light emitting unit region, the second wire is connected with the second light emitting unit, passes through the second light emitting unit region and is located at an outer side of the first light emitting unit region.

20 Claims, 5 Drawing Sheets

(58) Field of Classification Search
CPC ............ H01L 33/62; H01L 2933/0066; H01L 2933/0091; H01L 33/44; H01L 33/38; G09F 9/30; G09F 9/33; G09G 3/32; G09G 3/342; G02F 1/133603; G02F 1/133612
USPC .......... 257/362, E23.024, E23.079, E23.112, 257/E23.141; 313/111; 362/23.07, 358, 362/612, 545, 555, 800
See application file for complete search history.

(56) References Cited

U.S. PATENT DOCUMENTS

| | | | |
|---|---|---|---|
| 10,297,584 | B2 | 5/2019 | Makanoeich et al. |
| 11,004,382 | B2 | 5/2021 | Li et al. |
| 11,696,479 | B2 * | 7/2023 | Lee ........................ H10K 59/12 345/174 |
| 2008/0143379 | A1 * | 6/2008 | Norman ................. H05K 1/029 257/E23.079 |
| 2011/0273410 | A1 | 11/2011 | Park et al. |
| 2012/0294007 | A1 | 11/2012 | Matsumoto et al. |
| 2012/0299022 | A1 | 11/2012 | Hussell |
| 2014/0084775 | A1 * | 3/2014 | Kobori .................... F21V 13/02 313/111 |
| 2015/0069432 | A1 | 3/2015 | Chiu |
| 2018/0366440 | A1 * | 12/2018 | Chen ................. H01L 23/49833 |
| 2020/0035148 | A1 | 1/2020 | Xuan et al. |
| 2022/0123043 | A1 * | 4/2022 | Yang ....................... H01L 33/62 |
| 2022/0123044 | A1 * | 4/2022 | Yang ....................... H01L 33/62 |
| 2022/0123094 | A1 * | 4/2022 | Qiu ....................... G09G 3/3233 |
| 2022/0123191 | A1 * | 4/2022 | Yamada .................. H01L 33/62 |
| 2022/0208910 | A1 * | 6/2022 | Zhang .................... H10K 59/40 |
| 2023/0165081 | A1 * | 5/2023 | Wang .................. H10K 59/1216 257/40 |
| 2024/0055412 | A1 * | 2/2024 | Kim .................. H01L 33/0075 |
| 2024/0079443 | A1 * | 3/2024 | Yang .................... H01L 27/156 |

FOREIGN PATENT DOCUMENTS

| | | | | |
|---|---|---|---|---|
| CN | 207216221 | U | | 4/2018 |
| CN | 108877645 | A | | 11/2018 |
| CN | 108922884 | A | * | 11/2018 ......... H01L 27/0207 |
| CN | 109116626 | A | | 1/2019 |
| CN | 109935612 | A | | 6/2019 |
| CN | 110085164 | A | | 8/2019 |
| CN | 110136637 | A | | 8/2019 |
| CN | 110379829 | A | * | 10/2019 ......... H01L 25/0753 |
| CN | 110658651 | A | | 1/2020 |
| CN | 111312740 | A | * | 6/2020 ............. H01L 22/14 |
| CN | 112335051 | A | * | 2/2021 ....... H01L 25/0753 |
| JP | 2008198430 | A | | 8/2008 |
| WO | WO-2021125574 | A1 | * | 6/2021 ....... H01L 21/76895 |

OTHER PUBLICATIONS

First Chinese Office Action from Chinese Patent Application No. 202080000066.4 dated May 5, 2022.

* cited by examiner

LIGHT EMITTING SUBSTRATE, WIRING SUBSTRATE AND DISPLAY DEVICE

TECHNICAL FIELD

At least one embodiment of the present disclosure relates to a light emitting substrate, a wiring substrate and a display device.

BACKGROUND

At present, with the continuous progress of display technology, requirements of users for brightness, contrast and other performance of products are also increasing. On the one hand, mini light emitting diode (Mini LED) can be used as a backlight source. When Mini LED as a backlight source is combined with traditional liquid crystal display panel, by controlling the switch of Mini LED in the partition, a liquid crystal display device can have high contrast comparable to an organic light emitting diode display device. On the other hand, Mini LED can also be directly made into a large-size display product, which has a good market prospect.

SUMMARY

Embodiments of the present disclosure provide a light emitting substrate, a wiring substrate and a display device.

At least an embodiment of the present disclosure provides a light emitting substrate, comprising: a base substrate; a plurality of light emitting units, arrayed on the base substrate in a first direction and a second direction; and a first electrode wire, located on the base substrate and comprising a first wire and a second wire which extend in the first direction. The plurality of light emitting units comprise a plurality of first light emitting units and a plurality of second light emitting units, a position where each of the plurality of first light emitting units is located is one first light emitting unit region, a position where each of the plurality of second light emitting units is located is one second light emitting unit region, the first light emitting unit is connected with the first wire, the first wire passes through the first light emitting unit region and is located at an outer side of the second light emitting unit region, the second light emitting unit is connected with the second wire, and the second wire passes through the second light emitting unit region and is located at an outer side of the first light emitting unit region.

In some examples, the first light emitting units and the second light emitting units are alternately arranged in a row of light emitting units arranged in the first direction, and among the light emitting units located in a same row and the first electrode wires connected with the light emitting units located in the same row, an arrangement sequence from the first light emitting unit to the second wire is the same as an arrangement sequence from the second light emitting unit to the first wire in the second direction.

In some examples, the first electrode wire further comprises a first connection portion and a second connection portion, and two ends of the first connection portion are respectively connected with the first wire passing through the first light emitting unit region and the first wire located at the outer side of the second light emitting unit region; two ends of the second connection portion are respectively connected with the second wire passing through the second light emitting unit region and the second wire located at the outer side of the first light emitting unit region, the first connection portion and the second connection portion are located between the first light emitting unit and the second light emitting unit which are adjacent to each other, and the first connection portion and the second connection portion are intersected with each other and insulated from each other.

In some examples, the light emitting substrate comprises two first edges extending in the first direction, and in the first electrode wires connected with at least one row of light emitting units close to the first edge of the light emitting substrate, the first wire is located at a side of the second light emitting unit region away from the first edge of the light emitting substrate, and the second wire is located at a side of the first light emitting unit region away from the first edge of the light emitting substrate.

In some examples, the light emitting substrate comprises: a plurality of light emitting regions, arrayed in the first direction and the second direction, wherein each of the plurality of light emitting regions comprises one of the plurality of light emitting units, the light emitting unit in each of the plurality of light emitting regions is located at a position close to a corner where a first side and a second side of the each of the plurality of light emitting regions are connected with each other, and the first side and the second side of the each of the plurality of light emitting regions extend in the first direction and the second direction, respectively.

In some examples, the light emitting substrate further comprises two second edges extending in the second direction, the plurality of light emitting regions comprise one row of first light emitting regions arranged in the first direction and one column of second light emitting regions arranged in the second direction, the row of first light emitting regions are located at one of the first edges of the light emitting substrate, and the column of second light emitting regions are located at one of the second edges of the light emitting substrate, the plurality of light emitting regions further comprise a plurality of third light emitting regions; in the first direction, a size of each of the plurality of second light emitting regions is less than a size of each of the plurality of third light emitting regions; and in the second direction, a size of each of the plurality of first light emitting regions is less than a size of each of the plurality of third light emitting regions.

In some examples, the light emitting substrate further comprises: at least one of a first bonding region and a second bonding region, located at an edge of the light emitting substrate. The first bonding region is located in the row of first light emitting regions, and the second bonding region is located in the column of second light emitting regions, in the row of first light emitting regions, the first bonding region is located at a side of each light emitting unit away from the first side of the first light emitting region; and in the column of second light emitting regions, the second bonding region is located at a side of each light emitting unit away from the second side of the second light emitting region.

In some examples, the light emitting substrate further comprises: a second electrode wire, extending in the second direction, the second electrode wire being located between the first wire and the base substrate. The first wire is arranged in the same layer as the second wire, one of the first connection portion and the second connection portion is arranged in the same layer as the first wire, and the other of the first connection portion and the second connection portion is arranged in the same layer as the second electrode wire.

In some examples, the second electrode wire comprises a third wire and a fourth wire, each of the plurality of light emitting unit comprises three light emitting sub-units, one of the three light emitting sub-units is connected with the third wire, and the other two of the three light emitting sub-units are connected with the fourth wire, and in the first direction, a width of the fourth wire is greater than a width of the third wire.

In some examples, in the second electrode wire connected with the light emitting units in the second light emitting region where the second bonding region is located, the fourth wire is located at a side of the third wire away from the second bonding region.

In some examples, the first bonding region comprises one row of first electrode strips arranged in the first direction, and a count of the first electrode strips is greater than a count of the second electrode wires; the second bonding region comprises a column of second electrode strips arranged in the second direction, and a count of the second electrode strips is greater than a count of the first electrode wires.

In some examples, in a column of the third light emitting regions located at the second edge of the light emitting substrate and arranged in the second direction, the second electrode wire comprises a third connection portion between the light emitting units and the base substrate, and the third wire and the fourth wire are both electrically connected with corresponding light emitting units through the third connection portion, and the third wire and the fourth wire are both located at a side of the light emitting units close to the second bonding region.

In some examples, each of the plurality of light emitting units comprises a plurality of light emitting sub-units arranged in the second direction, and the first electrode wire arranged between adjacent light emitting sub-units in each of the plurality of light emitting units is only connected with the adjacent light emitting sub-units.

In some examples, each of the plurality of light emitting sub-units comprises a connection line unit and a light emitting diode chip connected with the connection line unit, the light emitting diode chip is located at a side of the connection line unit away from the base substrate, each connection line unit comprises at least two electrical contact pairs, each electrical contact pair comprises a first electrode contact and a second electrode contact; in each connection line unit, first electrode contacts are electrically connected with each other, second electrode contacts are electrically connected with each other, and only one electrical contact pair of the at least two electrical contact pairs is connected with the light emitting diode chip.

At least an embodiment of the present disclosure provides a display device, comprising the light emitting substrate as mentioned above, the light emitting substrate is a display panel.

At least an embodiment of the present disclosure provides a wiring substrate, comprising: a base substrate; a plurality of connection line unit groups, arrayed on the base substrate in a first direction and a second direction; and a first electrode wire, located on the base substrate and comprising a first wire and a second wire which extend in the first direction. The plurality of connection line unit groups comprise first connection line unit groups and second connection line unit groups, a position where each of the first connection line unit groups is located is one first connection line region, a position where each of the second connection line unit groups is located is one second connection line region, the first connection line unit group is connected with the first wire, the first wire passes through the first connection line region and is located at an outer side of the second connection line region, the second connection line unit group is connected with the second wire, and the second wire passes through the second connection line region and is located at an outer side of the first connection line region.

In some examples, the first connection line unit groups and the second connection line unit groups are alternately arranged in a row of connection line unit groups arranged in the first direction, and among the connection line unit groups located in a same row and the first electrode wires connected with the connection line unit groups located in the same row, an arrangement sequence from the first connection line unit group to the second wire is the same as an arrangement sequence from the second connection line unit group to the first wire in the second direction.

In some examples, the first electrode wire further comprises a first connection portion and a second connection portion, and two ends of the first connection portion are respectively connected with the first wire passing through the first connection line region and the first wire located at the outer side of the second connection line region; two ends of the second connection portion are respectively connected with the second wire passing through the second connection line region and the second wire located at the outer side of the first connection line region, the first connection portion and the second connection portion are located between the first connection line unit group and the second connection line unit group which are adjacent to each other, and the first connection portion and the second connection portion are intersected with each other and insulated from each other.

In some examples, the wiring substrate further comprises: a second electrode wire, extending in the second direction, the second electrode wire being located between the first wire and the base substrate, the first wire is arranged in the same layer as the second wire, one of the first connection portion and the second connection portion is arranged in the same layer as the first wire, and the other of the first connection portion and the second connection portion is arranged in the same layer as the second electrode wire.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
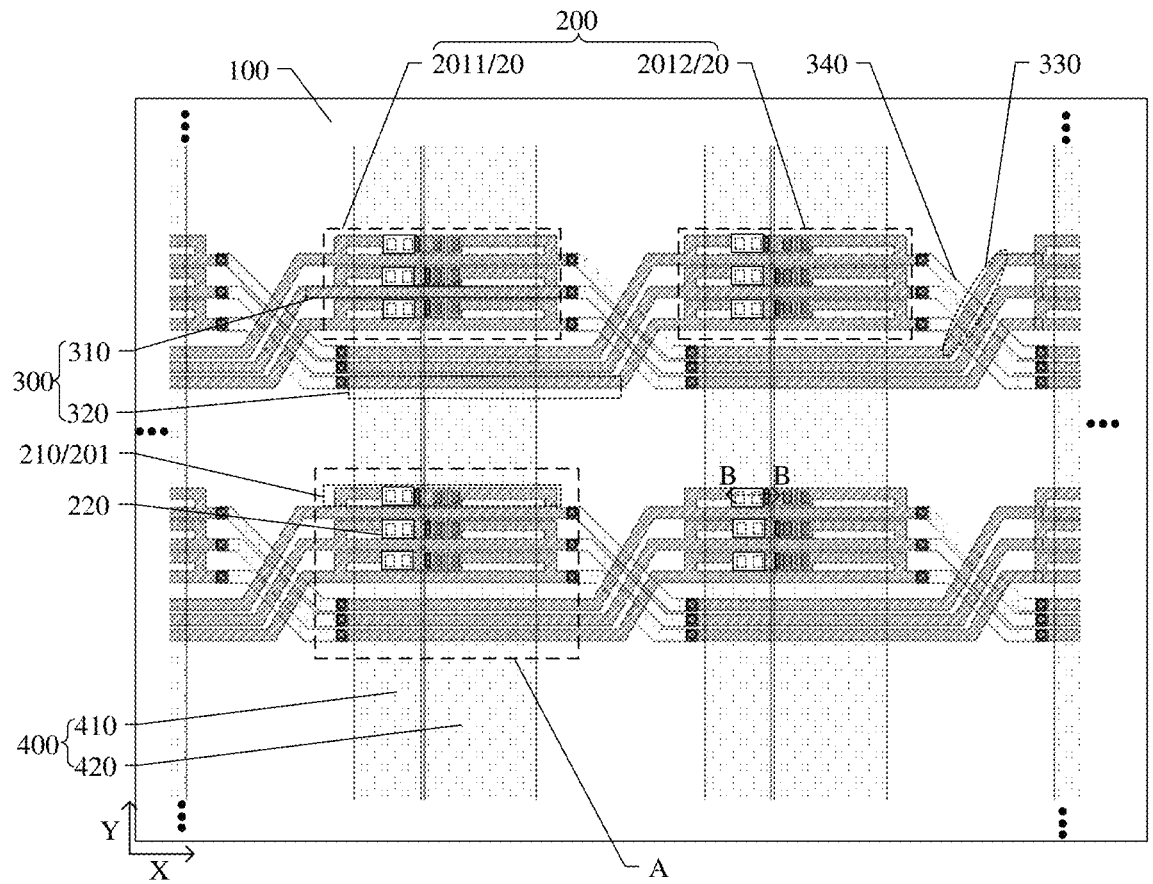
FIG. 1 is a schematic diagram of a partial planar structure of a light emitting substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Embodiments of the present disclosure provide a light emitting substrate, a wiring substrate and a display device. The light emitting substrate includes a base substrate, and a plurality of light emitting units and a first electrode wire which are located on the base substrate. The plurality of light emitting units are arrayed on the base substrate in a first direction and a second direction; and the first electrode wire include a first wire and a second wire which extend in the first direction. The plurality of light emitting units include a plurality of first light emitting units and a plurality of second light emitting units, a position where each first light emitting unit is located is one first light emitting unit region, a position where each second light emitting unit is located is one second light emitting unit region, the first light emitting unit is connected with the first wire, the first wire passes through the first light emitting unit region and is located at an outer side of the second light emitting unit region, the second light emitting unit is connected with the second wire, and the second wire passes through the second light emitting unit region and is located at an outer side of the first light emitting unit region. In the embodiments of the present disclosure, in the case where the first electrode wire connected with the plurality of light emitting units includes the first wire and the second wire, the first electrode wire passing through a light emitting unit region where a light emitting unit is located is only the first electrode wire connected with the light emitting unit, so that the size of the light emitting unit can be designed to be relatively small to realize high-density display or high-contrast display.

The light emitting substrate, the wiring substrate and the display device provided by the embodiments of the present disclosure will be described below with reference to the accompanying drawings.

FIG. 1 is a schematic diagram of a partial planar structure of a light emitting substrate provided by an embodiment of the present disclosure. As shown in FIG. 1, the light emitting substrate in the embodiment of the present disclosure includes a base substrate 100, and a plurality of light emitting units 200 and first electrode wires 300 which are located on the base substrate 100. The plurality of light emitting units 200 are arrayed on the base substrate 100 in a first direction and a second direction. FIG. 1 is illustrated by taking that the X direction is the first direction and the Y direction is the second direction as an example, and the first direction is intersected with the second direction. For example, the first direction is perpendicular to the second direction, and the embodiment of the present disclosure includes but is not limited thereto. The embodiment of the present disclosure takes that the first direction is a row direction and the second direction is a column direction as an example, where the column direction and the row direction are relative. For example, the first direction and the second direction can also be interchanged, that is, the first direction can also be referred to as the column direction and the second direction can also be referred to as the row direction.

As shown in FIG. 1, the position where each light emitting unit 200 is located is a light emitting unit region 20, that is, one light emitting unit 200 is located in one light emitting unit region 20. One first light emitting unit 2011 is located in one first light emitting unit region, and one second light emitting unit 2012 is located in one second light emitting unit region. The first electrode wire 300 includes a first wire 310 and a second wire 320, both of which extend in the first direction. The plurality of light emitting units 200 include a plurality of first light emitting units 2011 and a plurality of second light emitting units 2012, each first light emitting unit 2011 is connected with a corresponding first wiring 310, each second light emitting unit 2012 is connected with a corresponding second wiring 320, and only the first electrode wire 300 connected with a light emitting unit 200 passes through the light emitting unit region 20 where the light emitting unit 200 is located.

For example, the first wire 310 connected with a first light emitting unit 2011 passes through the light emitting unit region 20 where the first light emitting unit 2011 is located, i.e., the first light emitting unit region, and the second wire 320 not connected with the first light emitting unit 2011 is located at the outer side of the first light emitting unit region. Similarly, the second wire 320 connected with a second light emitting unit 2012 passes through the light emitting unit region 20 where the second light emitting unit 2012 is located, i.e., the second light emitting unit region, and the first wire 310 not connected with the second light emitting unit 2012 is located at the outer side of the second light emitting unit region.

For example, the light emitting unit includes at least one light emitting diode (LED) chip. The light emitting diode is a current drive element, and the current flowing through a signal line thereof is greater than that of an ordinary display product. With the miniaturization of the size of LED, the number of LEDs on the base substrate increases, and the load at a driving line (such as the first electrode wire) increases accordingly, so it is necessary to optimize the thin film metal wire to reduce resistance power consumption and temperature rise. Compared with the general case of connecting a row of light emitting units (e.g., a row of pixels) with one first electrode wire, in the embodiment of the present disclosure, one part of the plurality of light emitting units arranged in the first direction are connected with the first wire, and the other part of the plurality of light emitting units arranged in the first direction are connected with the second wire, which can reduce the number of light emitting units connected with each first electrode wire, thereby effectively reducing the current in each first electrode wire and reducing the power consumption of the first electrode wire.

In the embodiment of the present disclosure, in the case where the first electrode wire connected with one row of the plurality of light emitting units include the first wire and the second wire, only the first electrode wire connected with a light emitting unit passes through a light emitting unit region where the light emitting unit is located, while the first electrode wire not connected with the light emitting unit is arranged at the outer side of the light emitting unit region, so that the size of the light emitting unit can be designed to be relatively small to realize high-density display or high-contrast display.

For example, as shown in FIG. 1, each light emitting unit 200 includes a plurality of light emitting sub-units 201 arranged in the second direction, and in each light emitting unit 200, the first electrode wire 300 arranged between adjacent light emitting sub-units 201 is only the first electrode wire 300 connected with the adjacent light emitting sub-units 201.

For example, as shown in FIG. 1, taking that the first light emitting unit 2011 includes three light emitting sub-units 201 as an example, the first electrode wire 300 arranged between adjacent light emitting sub-units 201 is a first wire 310, and the first wire 310 is connected with one of the adjacent light emitting sub-units 201 on both sides of the first wire 310.

In the embodiment of the present disclosure, only the first electrode wire connected with the light emitting sub-unit included in the light emitting unit passes through the gap between adjacent light emitting sub-units, so that the distance between adjacent light emitting sub-units included in the light emitting unit can be set to be relatively small (for example, the distance between adjacent light emitting sub-units can be 75 microns), and further, the size of the light emitting unit can be designed to be relatively small to improve the fineness of the display picture.

For example, the first electrode wire located at the outer side of the light emitting unit region will not affect the size of the light emitting unit, therefore, the line width of the first electrode wire located at the outer side of the light emitting unit region can be designed to be greater than the line width of the first electrode wire passing through the light emitting unit region, so as to reduce resistance and power consumption. The embodiment of the present disclosure is not limited to this case, and in order to facilitate the manufacturing of the first electrode wire, the line width of the first electrode wire passing through the light emitting unit region can also be designed to be equal to the line width of the first electrode wire located at the outer side of the light emitting unit region.

For example, as shown in FIG. 1, in a row of the plurality of light emitting units 200 arranged in the first direction, the first light emitting units 2011 and the second light emitting units 2012 are alternately arranged, and among the light emitting units 200 located in the same row and the first electrode wires 300 connected with the light emitting units 200 located in the same row, the arrangement sequence from the first light emitting unit 2011 to the second wire 320 is the same as the arrangement sequence from the second light emitting unit 2012 to the first wire 312 in the second direction. That is, in the second direction, the arrangement sequence of the first wires and the second wires at the position of the first light emitting unit region is opposite to the arrangement sequence of the first wires and the second wires at the position of the second light emitting unit region.

For example, as shown in FIG. 1, taking the first emitting unit 2011 and the second light emitting unit 2012 which are arranged in the first direction and are adjacent to each other as an example, and taking the positive Y direction (the direction indicated by the arrow) as an example, the first wire 310 connected with the first light emitting unit 2011 can be located at a lower side of the light emitting unit region 20 where the second light emitting unit 2012 is located, and the second wire 320 connected with the second light emitting unit 2012 can also be located at a lower side of the light emitting unit region 20 where the first light emitting unit 2011 is located, so that the distance between adjacent light emitting units arranged in the second direction can be reduced, so as to reduce the size of the light emitting unit. The embodiment of the present disclosure is described by taking that the relative positional relationship between the first light emitting unit region and the second wire is the same as the relative positional relationship between the second light emitting unit region and the first wire as an example.

For example, as shown in FIG. 1, the first electrode wire 300 further includes a first connection portion 330 and a second connection portion 340. Two ends of the first connection portion 330 are respectively connected with the first wire 310 passing through the light emitting unit region 20 where the first light emitting unit 2011 is located and the first wire 310 located at the outer side of the light emitting unit region 20 where the second light emitting unit 2012 is located.

For example, as shown in FIG. 1, two ends of the second connection portion 340 are respectively connected with the second wire 320 passing through the light emitting unit region 20 where the second light emitting unit 2012 is located and the second wire 320 located at the outer side of the light emitting unit region 20 where the first light emitting unit 2011 is located.

For example, as shown in FIG. 1, the first connection portion 330 and the second connection portion 340 are located between the first light emitting unit 2011 and the second light emitting unit 2012 which are adjacent to each other, and the first connection portion 330 and the second connection portion 340 are intersected with each other and insulated from each other.

For example, as shown in FIG. 1, the first wire 310 extends in the first direction, and the first wire 310 passing through the light emitting unit region 20 where the first light emitting unit 2011 is located and the first wire 310 located at the outer side of the light emitting unit region 20 where the second light emitting unit 2012 is located are not on the same straight line, so that the extending direction of the first connection portion 330 is intersected with the first direction to connect the two parts of the first wire. Similarly, the second wire 320 extends in the first direction, and the second wire 320 passing through the light emitting unit region 20 where the second light emitting unit 2012 is located and the second wire 320 located at the outer side of the light emitting unit region 20 where the first light emitting unit 2011 is located are not on the same straight line, so that the extending direction of the second connection portion 340 is intersected with the first direction.

For example, as shown in FIG. 1, the relative positional relationship between the light emitting unit region 20 where the first light emitting unit 2011 is located and the second wire 320 is the same as the relative positional relationship between the light emitting unit region 20 where the second light emitting unit 2012 is located and the first wire 310, so the first connection portion 330 and the second connection portion 340 are intersected with each other. In order to make the first connection portion 330 and the second connection portion 340 insulated from each other, the first connection portion 330 and the second connection portion 340 can be disposed on different layers.

For example, as shown in FIG. 1, the first wire 310 and the second wire 320 are arranged in the same layer and made of the same material. The first wire 310 and the second wire 320 can be structures formed by performing one patterning process on the same material.

For example, as shown in FIG. 1, the light emitting substrate further includes a second electrode wire 400 extending in the second direction. For example, the first electrode wires 300 are connected with a row of light emitting units 200 arranged in the first direction, the second electrode wires 400 are connected with a column of light emitting units 200 arranged in the second direction, and the first electrode wires 300 and the second electrode wires 400 form a mesh structure to realize passive driving. The present disclosure is described by taking that the first electrode wire is a negative electrode wire and the second electrode wire is a positive electrode wire as an example, but is not limited thereto. They can also be interchanged, that is, the first electrode wire can be the positive electrode wire, and the second electrode wire can be the negative electrode wire.

For example, as shown in FIG. 1, the second electrode wire 400 is located between the first wire 310 and the base substrate 100, and between the second wire 320 and the base substrate 100, and an insulating layer is provided between the second electrode wire 400 and the film layer where the first wire 310 is located. One of the first connection portion 330 and the second connection portion 340 is arranged in the same layer as the first wire 310, and the other of the first connection portion 330 and the second connection portion 340 is arranged in the same layer as the second electrode wire 400. The connection portion arranged in the same layer as the second electrode wire 400 is electrically connected with the first wire 310 or the second wire 320 through a via hole located at the outer side of the second electrode wire 400.

For example, as shown in FIG. 1, one first electrode wire 300 includes a plurality of first wires 310 which are separated from each other, and the first electrode wire 300 further includes a plurality of first connection portions 330 to connect the first wires 310 that are separated from each other. A first part of the plurality of first connection portions 330 are arranged in the same layer as the first wire 310, a second part of the plurality of first connection portions 330 are arranged in the same layer as the second electrode wire 400, and the first part of the plurality of first connection portions 330 and the second part of the plurality of first connection portions 330 are alternately arranged in the first direction. Similarly, one first electrode wire 300 includes a plurality of second wires 320 which are separated from each other, and the first electrode wire 300 also includes a plurality of second connection portions 340 to connect the second wires 320 that are separated from each other. A first part of the plurality of second connection portions 340 are arranged in the same layer as the second wire 320, a second part of the plurality of second connection portions 340 are arranged in the same layer as the second electrode wire 400, and the first part of the plurality of second connection portions 340 and the second part of the plurality of second connection portions 340 are alternately arranged in the first direction. The above-mentioned arrangement mode of first wires (second wires) that are separated from each other means that the physical positions of any two first wires (second wires) are separated, but they are not limited to being electrically connected.

For example, as shown in FIG. 1, two ends of the first wire 310 are respectively connected with two first connection portions 330, and one of the two first connection portions 330 is in the same layer as the first wire 310 and the other of the two first connection portions 330 is in the same layer as the second electrode wire 400. For example, the first connection portion 330 in the same layer as the first wire 310 can be integrated with the first wire 310. Similarly, two ends of the second wire 320 are respectively connected with two second connection portions 340, and one of the two second connection portions 340 is in the same layer as the second wire 320 and the other of the two second connection portions 340 is in the same layer as the second electrode wire 400. The second connection portion 340 in the same layer as the second wire 320 can be integrated with the second wire 320.

In the embodiment of the present disclosure, one of the first connection portion and the second connection portion is arranged in the same layer as the first wire, and the other of the first connection portion and the second connection portion is arranged in the same layer as the second electrode wire, which can prevent the first connection portion and the second connection portion from being electrically connected, and can also avoid adding a new metal film layer to increase the thickness of the light emitting substrate.

Figure 2:
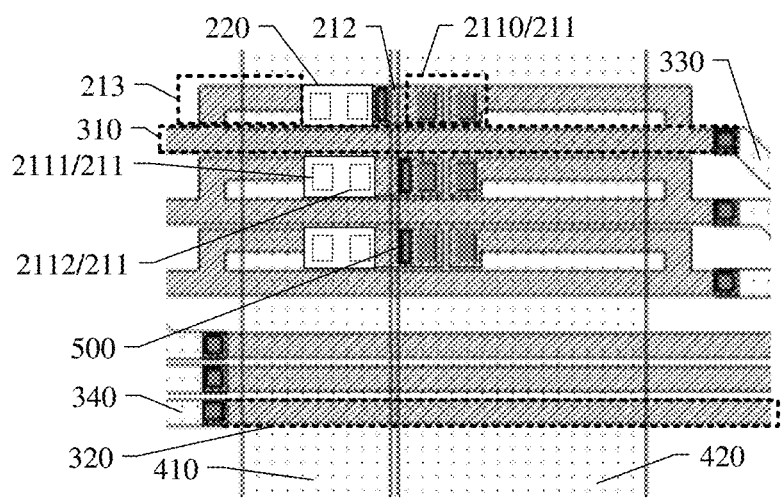
FIG. 2 is an enlarged view of part A shown in FIG. 1.

For example, FIG. 2 is an enlarged view of part A shown in FIG. 1. As shown in FIG. 1 and FIG. 2, each light emitting unit 200 includes at least one light emitting sub-unit 201, the light emitting sub-unit 201 includes a connection line unit 210 and one light emitting diode chip 220 connected with the connection line unit 210, and the light emitting diode chip 220 is located at one side of the connection line unit 210 away from the base substrate 100. Each connection line unit 210 includes at least two electrical contact pairs 211, each electrical contact pair 211 includes a positive electrode contact 2111 and a negative electrode contact 2112; in each connection line unit 210, positive electrode contacts 2111 are electrically connected with each other, negative electrode contacts 2112 are electrically connected with each other, and only one electrical contact pair 211 of the at least two electrical contact pairs 211 is connected with the light emitting diode chip, and the other electrical contact pair 211 of the at least two electrical contact pairs 211 serves as a backup electrical contact pair 2110. When the light emitting diode chip connected with one electrical contact pair is defective, or the electrical contact pair is broken, which causes the light emitting diode chip to fail to emit light, a light emitting diode chip can be connected with any one backup electrical contact pair so as to repair the light emitting sub-unit. The present disclosure is described by taking that the second electrode contact is the positive electrode contact and the first electrode contact is the negative electrode contact point as an example, but is not limited thereto, and they can be interchanged.

For example, as shown in FIG. 1 and FIG. 2, the embodiment of the present disclosure takes that each connection line unit 210 includes two electrical contact pairs 211 as an example, one of the two electrical contact pairs 211 is connected with the light emitting diode chip 220, and the other of the two electrical contact pairs 211 serves as a backup electrical contact pair. But the embodiment of that present disclosure is not limited thereto.

For example, the light emitting diode chip in the embodiment of the present disclosure can be a Mini LED. For example, the maximum size of the mini LED in the direction parallel to the base substrate 100 is not more than 500 microns. For example, the size of the mini LED can be 0.1 mm×0.17 mm. The embodiment of the present disclosure is not limited to this case, and the light emitting diode chip can also be a micro LED chip. Because the size of the light emitting diode chip adopted in the embodiment of the present disclosure is relatively small, for example, the size of each light emitting diode chip accounts for a low proportion (e.g., about 2%) of the pixel region or light emitting region where the light emitting unit is located, there is sufficient space for setting the backup electrical contact pair compared with other types of display panels.

For example, the connection line unit can also include three or more electrical contact pairs, and in the case where the connection line unit includes three or more than three electrical contact pairs, in which one electrical contact pair is connected with the light emitting diode chip, and the other electrical contact pairs serve as backup electrical contact pairs. For example, the case of the light emitting diode chip being defective can include short circuit or open circuit between the anode and cathode of the light emitting diode chip; and in this case, the connection between the cathode of the defective light emitting diode chip and the negative electrode wire can be cut off, and then, a backup light emitting diode chip can be connected with the backup electrical contact pair, thus repairing the light emitting sub-unit. It should be noted that the backup light emitting diode chip connected with the backup electrical contact pair and the defective light emitting diode chip should be chips emitting light of the same color.

For example, as shown in FIG. 1 and FIG. 2, each connection line unit 210 further includes a positive electrode connection portion 212, the positive electrode connection portion 212 is arranged in the same layer as the first wire 310, and the positive electrode contact 2111 in each connection line unit 210 is connected with the second electrode wire 400 through the positive electrode connection portion 212. For example, the positive electrode connection portion 212 can be electrically connected with the second electrode wire 400 through a via hole 500 penetrating through the insulating layer.

For example, as shown in FIG. 1 and FIG. 2, each connection line unit 210 further includes a negative connection portion 213 connected with each negative electrode contact 2112, the negative connection portion 213 is located at one side of the negative electrode contact 2112 away from the positive electrode contact 2111, the negative electrode contact 2112 is connected with the first electrode wire 300 through the negative connection portion 213, and the orthographic projection of at least a part of the negative connection portion 213 on the base substrate 100 is not overlapped with the orthographic projection of the second electrode wire 400 on the base substrate 100. In the embodiment of the present disclosure, by setting a negative connection portion that is not overlapped with both the second electrode wire and the first electrode wire at least partially, the negative connection portion can be cut by means of, for example, laser cutting, when the light emitting diode chip is defective, so as to disconnect the connection between the negative electrode contact and the first electrode wire, so as to realize repairing the light emitting sub-unit. By setting the negative connection portion, the influence of the cutting process on the second electrode wire and the first electrode wire can be avoided.

For example, as shown in FIG. 1 and FIG. 2, the light emitting unit 200 can include light emitting diode chips 220 emitting light of different colors arranged in the Y direction, and a column of backup electrical contact pairs 2110 arranged in the Y direction is reserved beside the electrical contact pairs of the light emitting diode chips 220, so as to prevent the occurrence of bad spots from affecting the display effect. In the case where the light emitting diode chip connected with the electrical contact pair is not bright or has a poor display effect due to process problems or other reasons, a light emitting diode chip emitting light of the same color as the problematic light emitting diode chip can be reconnected with the backup electrical contact pair, and the negative electrode connection portion connected with the cathode of the problematic light emitting diode chip can be cut off by laser, so that the current flows through the newly connected light emitting diode chip. The embodiment of the present disclosure does not limit the placing order and the number of light emitting diode chips, and they are compatible on the basis of satisfying optical design, and the number and position of light emitting diode chips can be adjusted according to actual optical and circuit requirements.

For example, as shown in FIG. 1 and FIG. 2, the second electrode wire 400 includes a third wire 410 and a fourth wire 420, and each light emitting unit 200 includes three light emitting sub-units 201, one of the three light emitting sub-units 201 is connected with the third wire 410, and the other two of the three light emitting sub-units 201 are connected with the fourth wire 420. In the embodiment of the present disclosure, each light emitting unit is connected with two second electrode wires, so that the light emitting sub-units emitting light of one color can be independently controlled.

For example, the light emitting unit can include a red light emitting sub-unit, a green light emitting sub-unit, and a blue light emitting sub-unit. The turn-on voltages (referring to the operation voltage when the brightness of the element reaches 1 cd/m$^2$) of the green light emitting sub-unit and the blue light emitting sub-unit are similar, while the turn-on voltage of the red light emitting sub-unit is quite different from those of the green light emitting sub-unit and the blue light emitting sub-unit described above, so the red light emitting sub-unit is connected with the third wire separately, while the green light emitting sub-unit and the blue light emitting sub-unit are connected with the fourth wire, thereby ensuring that all light emitting sub-units are applied with corresponding turn-on voltages, which can not only save electric energy, but also prevent overload voltage from being applied to a light emitting sub-unit emitting light of a certain color.

For example, in the first direction, the width of the fourth wire 420 is greater than the width of the third wire 410.

For example, the third wire 410 can be connected with the red light emitting sub-unit, and the fourth wire 420 can be connected with the green light emitting sub-unit and the blue light emitting sub-unit. The green light emitting sub-unit and the blue light emitting sub-unit emit light by inputting a relatively large current to the fourth wire 420, that is, the current controlling the green light emitting sub-unit and the blue light emitting sub-unit to emit light is larger than the current controlling the red light emitting sub-unit to emit light. In order to stabilize the temperature rise and other characteristics, the width of the fourth wire 420 is set to be greater than the width of the third wire 410.

Figure 3:
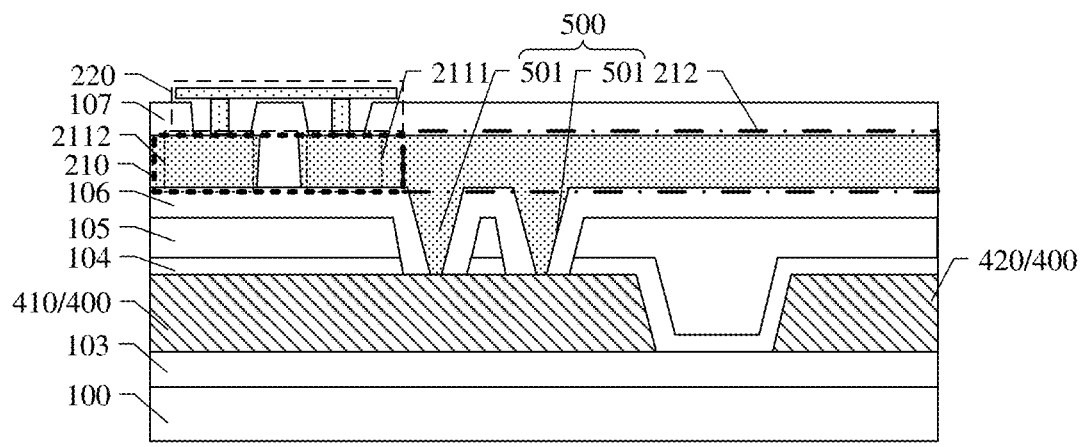
FIG. 3 is a cross-sectional view taken along line BB shown in FIG. 1.

For example, FIG. 3 is a cross-sectional view taken along line BB shown in FIG. 1. For example, as shown in FIG. 3, the base substrate 100 can be a glass substrate. In the embodiment of the present disclosure, a glass substrate provided with connection line units is adopted to replace a commonly used substrate, such as a printed circuit board (PCB) used for electrically connecting the light emitting diode chips in a backlight source or a display panel, so that the problem of poor heat dissipation performance of a common PCB substrate can be solved; moreover, the glass substrate is not easy to deform, so the manufacturing cost and the driving cost can be reduced in the process of manufacturing a large-size light emitting substrate.

For example, as shown in FIG. 1 and FIG. 3, the materials of the first wire 310, the second wire 320 and the second electrode wire 400 can be conductive materials such as copper. Taking that the materials of the above wires are copper as an example, two copper layers can be deposited on the base substrate by sputtering or can be formed on the base substrate by electroplating. For example, the greater the thicknesses of the first wire, the second wire and the second electrode wire, the lower the power consumption, and the better the display effect when the light emitting substrate is used as a display panel.

For example, as shown in FIG. 3, a first buffer layer 103 is disposed between the second electrode wire 400 and the base substrate 100, and the material of the first buffer layer 103 can include silicon nitride. A second buffer layer 104, a planarization layer 105 and a passivation layer 106 are sequentially disposed between the second electrode wire 400 and the first wire 310. The material of the planarization layer 105 can be resin, and the greater the thickness of the planarization layer 105, the smaller the coupling capacitance between the wire layers located on both sides of the planarization layer 105. The materials of the second buffer layer 104 and the passivation layer 106 can be silicon nitride, which is used to avoid the problem of poor adhesion caused by the direct contact between the planarization layer 105 and the metal layers on both sides of the planarization layer 105.

For example, as shown in FIG. 1 and FIG. 3, the second buffer layer 104, the planarization layer 105 and the passivation layer 106 are provided with a via hole region 500, so that the positive electrode connection portion 212 can be electrically connected with the second electrode wire 400. The embodiment of the present disclosure takes that the via hole region 500 includes two via holes 501 as an example, but is not limited to this case, and may also include one or more via holes.

For example, as shown in FIG. 3, an insulating layer 107 is provided at one side of the connection line unit 210 away from the base substrate 100, the insulating layer 107 includes two via holes to expose the positive electrode contact 2111 and the negative electrode contact 2112, respectively; the light emitting diode chip 220 is located at one side of the insulating layer 107 away from the connection line unit 210, and the anode in the light emitting diode chip 220 is electrically connected with the positive electrode contact 2111 through the via hole in the insulating layer 107, and the cathode included in the light emitting diode chip 220 is electrically connected with the negative electrode contact 2112 through the via holes in the insulating layer 107.

For example, as shown in FIG. 3, the positive electrode contact 2111 is integrated with the positive electrode connection portion 212, and the positive electrode connection portion 212 is connected with the positive electrode wire 400 through a plurality of via holes 500, so that the second electrode wire 400 is electrically connected with the anodes of the light emitting diode chips 220.

For example, as shown in FIG. 3, the positive electrode contact 2111 and the negative electrode contact 2112 are arranged in the same layer and spaced apart from each other.

For example, the surfaces of the positive electrode contact 2111 and the negative electrode contact 2112 away from the base substrate 100 can be located in the same plane as the surface of the positive electrode connection portion 212 away from the base substrate 100, and the embodiment of the present disclosure is not limited thereto. For example, the positive electrode contact 2111 and the negative electrode contact 2112 include two protrusions respectively inserted into two via holes of the insulating layer 107, and the anode and the cathode included in the light emitting diode chip 220 are electrically connected with the protrusions of the electrical contact pair through the via holes described above. The above protrusions can be formed by a halftone mask process.

Figure 4:
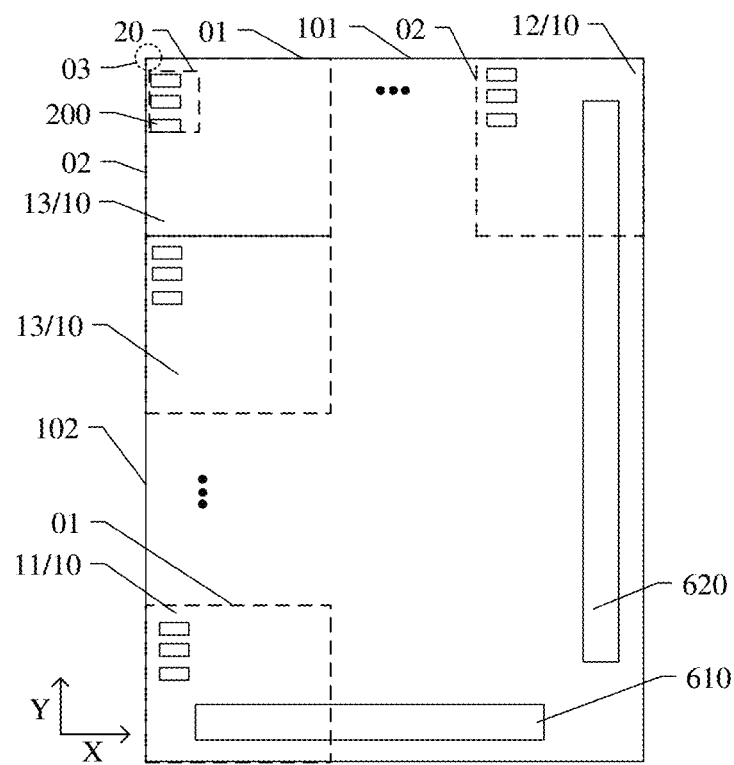
FIG. 4 is a schematic diagram of a planar structure of the light emitting substrate provided by the embodiment shown in FIG. 1.

For example, FIG. 4 is a schematic diagram of the planar structure of the light emitting substrate provided by the embodiment shown in FIG. 1, and FIGS. 5-7 are schematic diagrams of partial planar structures at three different positions of the light emitting substrate shown in FIG. 4. As shown in FIG. 4, the light emitting substrate includes a plurality of light emitting regions 10 arrayed in the first direction and the second direction. For example, the light emitting substrate further includes a bonding region located in the light emitting region 10, and the bonding region can be bonded with a flexible printed circuit (FPC) to realize the bonding of FPC on the front side of the light emitting substrate, thereby meeting the requirement of a narrow frame.

For example, the bonding region can include at least one of a first bonding region 610 extending in the first direction and a second bonding region 620 extending in the second direction. The bonding region is located at the edge of the light emitting substrate, and the bonding region is arranged in the light emitting region 10 located at the edge of the light emitting substrate.

For example, as shown in FIG. 4, there may be no distance between adjacent light emitting regions 10, or there may be a certain distance between adjacent light emitting regions 10, which is not limited in the embodiment of the present disclosure.

For example, as shown in FIG. 4, each light emitting region 10 includes one light emitting unit region 20, and the light emitting unit 200 in each light emitting region 10 is located at the corner where a first side 01 and a second side 02 of each light emitting region 10 are connected with each other, and the first side 01 and the second side 02 extend in the first direction and the second direction, respectively.

For example, each light emitting region 10 has a rectangular shape, and the first side 01 and second side 02 adjacent to the first side 01 of the light emitting region 10 extend in the first direction and the second direction, respectively; the first side 01 is intersected with the second side 02 to form a right angle 03, and the light emitting unit region 20 in each light emitting region 10 is located at a position close to the right angle 03 of the light emitting region 10. That is, the light emitting unit 200 is located at a position close to an included angle in the light emitting region 10. Taking that the positive Y direction (the direction indicated by the arrow) as upward and the direction indicated by the X direction is rightward as an example, the light emitting unit 200 is located at the upper left corner of the light emitting region 10. The light emitting unit is extremely close to the edge of the glass substrate (i.e., the base substrate) to reduce the frame size of the light emitting substrate as long as the process conditions are met. The embodiment of the present disclosure is not limited to the case that the light emitting unit in the light emitting region is arranged at the upper left corner, and the light emitting unit in the light emitting region can also be arranged at the upper right corner, the lower left corner or the lower right corner, as long as the light emitting unit is located at a position close to one of the four right angles of the light emitting region, so as to manufacture the light emitting substrate into a display panel with a narrow frame.

For example, in the case where the light emitting unit 200 in the light emitting region 10 is located in the upper left corner of the light emitting region 10, the right side and the lower side of the light emitting unit 200 in the light emitting region 10 are used for setting the first electrode wire and the bonding region. That is, in the light emitting region 10, the first electrode wire and the bonding region can be arranged at a position of the light emitting unit 200 away from the first side 01 of the right angle 03 and a position of the light emitting unit 200 away from the second side 02 of the right angle 03. In the embodiment of the present disclosure, the light emitting unit is arranged at an included angle position of the light emitting region, and by compressing the spacing between the light emitting sub-units included in the light emitting unit and optimizing the layout of the first electrode wire, not only the fineness of the display picture can be improved when the light emitting substrate is applied in a display panel, but also the FPC can be bonded in the light emitting regions of the last row and the last column, thereby meeting the requirement of narrow frame.

Figure 5:
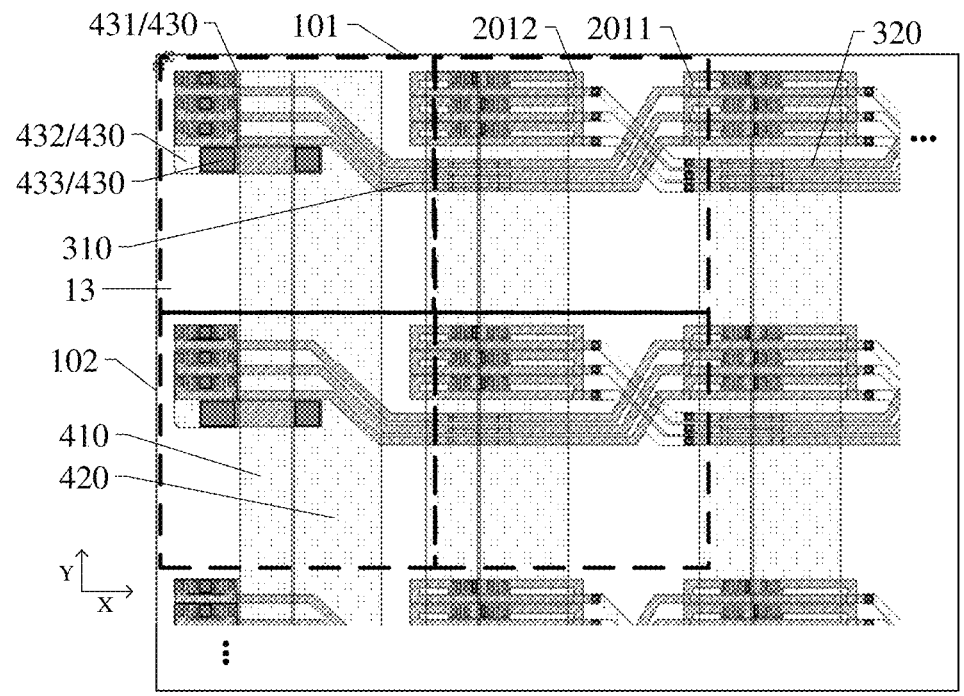
FIGS. 5-7 are schematic diagrams of partial planar structures at three different positions of the light emitting substrate shown in FIG. 4.
Figure 6:
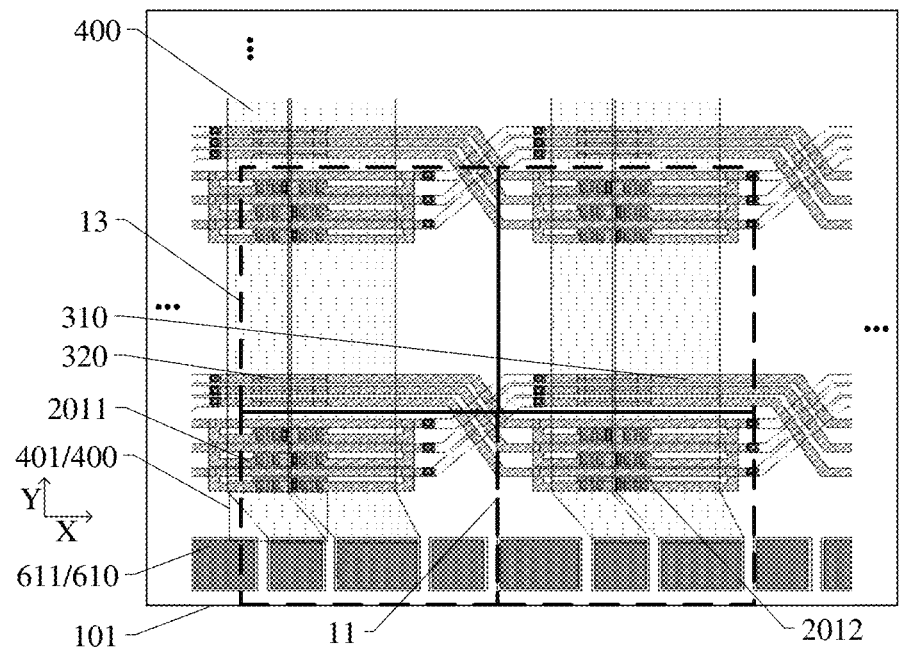

For example, as shown in FIGS. 5-6, the light emitting substrate includes two first edges 101 extending in the first direction, and in the first electrode wire 300 connected with at least one row of the plurality of light emitting units 200 close to the first edge 101, the first wire 310 is located at one side of the second light emitting unit region 2012 away from the first edge 101, and the second wire 320 is located at one side of the first light emitting unit region 2011 away from the first edge 101.

For example, the first row of light emitting units 200 shown in FIG. 5 is the first row of light emitting units 200 closest to one of the first edges 101, and the second row of light emitting units 200 shown in FIG. 6 is the last row of light emitting units 200 closest to the other of the first edges 101. As shown in FIG. 5, in the first electrode wire 300 connected with the first row of light emitting units 200, the first wire 310 is located at one side of the second light emitting unit region 2012 away from the first edge 101, and the second wire 320 is located at one side of the first light emitting unit region 2011 away from the first edge 101, so that the light emitting units 200 can be made as close as possible to the first edge 101 of the base substrate 100 to realize a narrow frame. As shown in FIG. 6, in the first electrode wire 300 connected with the last row of light emitting units 200, the first wire 310 is located at one side of the second light emitting unit region 2012 away from the first edge 101, and the second wire 320 is located at one side of the first light emitting unit region 2011 away from the first edge 101, therefore, it is avoided that the first wire 310 and the second wire 320 are overlapped with the first electrode strip 611 included in the first bonding region 610 in the direction perpendicular to the base substrate 100, and enough space is reserved for the first bonding region 610 to bond a part of the FPC onto the front of the light emitting substrate, so as to realize a narrow frame.

For example, as shown in FIG. 5, a boundary of an orthographic projection of the second electrode wire 400 connected with the first row of light emitting units 200 away from the first bonding region is not beyond a boundary an orthographic projection of the first row of light emitting units 200 away from the first bonding region, the orthographic projection of the second electrode wire 400 is an orthographic projection of the second electrode wire 400 on a straight line extending in the Y direction, and the orthographic projection of the first row of light emitting units 200 is an orthographic projection of the first row of light emitting units 200 on the straight line. That is, the upper boundary of the second electrode wire 400 is not beyond the upper boundary of the first row of light emitting units 200, so as to realize a narrow frame on the upper side of the light emitting substrate.

For example, as shown in FIGS. 4-7, in a column of third light emitting regions 13 arranged in the second direction and located at the second edge 102, the second electrode wire 400 includes a third connection portion 430 located between the light emitting unit 200 and the base substrate 100.

For example, as shown in FIG. 5, the third connection portion 430 includes a first part 431 and a second part 432 which are independent of each other, the third wire 410 is connected with one light emitting sub-unit through the first part 431 of the third connection portion 430, and the fourth wire 420 is connected with other two light emitting sub-units through the second part 432 of the third connection portion 430.

For example, as shown in FIG. 5, by providing the third connection portion 430, the third wire 410 and the fourth wire 420 can both be located at one side of the light emitting unit 200 close to the second bonding region 620, so that the side of the light emitting unit away from the second bonding region is not provided with wires, thereby realizing a narrow frame on the left side of the light emitting substrate.

For example, the first part 431 of the third connection portion 430 can be integrated with the third wire 410, the second part 432 of the third connection portion 430 is in the same layer as the fourth wire 420; the third connection portion 430 further includes a third part 433, the third part 433 is arranged in a different layer from the second electrode wire 400, and the second part 432 of the third connection portion 430 is connected with the fourth wire 420 through the third part 433.

For example, as shown in FIG. 5, the light emitting unit 200 is located at the upper left corner of the light emitting region 10, and in the light emitting region 10 at the upper left corner of the light emitting substrate, neither the left side nor the upper side of the light emitting unit 200 is provided with wires beyond edges of the light emitting unit, so that the left side and the upper side of the light emitting substrate can be designed with narrow frames. In addition, in the embodiment of the present disclosure, the second electrode wire is arranged at a position of the light emitting unit connected thereto away from the left side of the base substrate, which can prevent the second electrode wire from being damaged when cutting the left edge of the base substrate.

For example, according to the requirements of cutting accuracy of equipment and the distance needed for the insulating layer covering the wiring metal layer to avoid bare wires, a frame of 0.25 mm or more should be reserved between the edge of the base substrate and the light emitting unit. In order to reduce this frame limitation, on the basis of adopting the wiring scheme provided by the embodiment of the present disclosure, a dummy space of not less than 0.3 mm can be reserved between the edge of the base substrate and the light emitting unit, and then the distance between the edge of the base substrate and the light emitting unit can be made to be not more than 0.11 mm by grinding (the grinding precision is higher), so as to further realize a narrow frame.

For example, as shown in FIG. 4, the light emitting substrate further includes a first bonding region 610 extending in the first direction and a second bonding region 620 extending in the second direction.

For example, as shown in FIG. 4, the light emitting substrate includes two second edges 102 extending in the second direction, and the plurality of light emitting regions 10 include one row of first light emitting regions 11 extending in the first direction and one column of second light emitting regions 12 extending in the second direction. The row of first light emitting regions 11 are located at one of the first edges 101, the column of second light emitting regions 12 are located at one of the second edges 102. For example, the embodiment of the present disclosure is described by taking that the first bonding region 610 is located in the first light emitting region 11 and the second bonding region 620 is located in the second light emitting region 12 as an example, but is not limited to this case. For example, the plurality of light emitting regions 10 further include a plurality of third light emitting regions 13, the plurality of third light emitting regions 13 include the light emitting regions located in the intermediate region of the light emitting substrate, and also include the light emitting regions located at the other of the first edges 101 and at the other of the second edges 102 of the light emitting substrate. That is, the light emitting regions 10, other than one row of first light emitting regions 11 extending in the first direction and one column of second light emitting regions 12 extending in the second direction, are all third light emitting regions 13. In the first direction, the size of each second light emitting region 12 is less than the size of each third light emitting region 13, and in the second direction, the size of each first light emitting region 11 is less than the size of each third light emitting region 13.

For example, the light emitting substrate provided by the embodiment of the present disclosure can be a display panel. In the case where a plurality of display panels shown in FIG. 4 are spliced to form a large-size display panel, there will be a splicing seam with a certain width between adjacent display panels. The second light emitting region 12 and the first light emitting region 11 described above are located at the edge close to the splicing seam, and in the first direction, the sum of the sizes of the second light emitting region 12 and the splicing seam is approximately the same as the size of the third light emitting region 13; in the second direction, the sum of the sizes of the first light emitting region 11 and the splicing seam is approximately the same as the size of the third light emitting region 13. Therefore, on the large-size display panel including the splicing seam, the size of each light emitting region is the same, and the first light emitting region or the second light emitting region located at the edge of each display panel has the same display effect as the third light emitting region. When the large-size display panel displays, it is equivalent to that the splicing seam is located in the light emitting region, which can realize a seamless splicing display effect.

For example, taking the splicing of two light emitting substrates in the X(Y) direction as an example, the distance between a column (row) of light emitting units of the first light emitting substrate close to the second light emitting substrate and a column (row) of light emitting units of the second light emitting substrate close to the first light emitting substrate is equal to the distance between two adjacent columns (rows) of light emitting units in any one light emitting substrate, thus realizing the seamless splicing display effect.

For example, taking the splicing of two light emitting substrates as an example, the bonding region on the light emitting substrate is located at the edge of the light emitting substrate away from the splicing seam. That is, taking that the light emitting substrate shown in FIG. 4 is one light emitting substrate for splicing as an example, the other light emitting substrate is spliced on the upper side or left side of the light emitting substrate shown in FIG. 4, thus further reducing the width of the splicing seam, better realizing the seamless splicing display effect, and realizing higher resolution display products. For example, taking the splicing of four light emitting substrates as an example, the bonding region on the light emitting substrate is located at the edge of the light emitting substrate away from the splicing seam, which can further reduce the width of the splicing seam. Therefore, in the case where the number of light emitting substrates for splicing is small, it is beneficial to reduce the width of the splicing seam and realize display products with higher resolution by designing the splicing seam at the edge where the bonding region is not located.

For example, as shown in FIGS. 4-6, in the embodiment of the present disclosure, the light emitting unit 200 in the light emitting region 10 is located at the upper left corner of the light emitting region 10, therefore, the rightmost column of light emitting regions of the light emitting substrate are the second light emitting regions 12, the lowermost row of light emitting regions of the light emitting substrate are the first light emitting regions 11, and the light emitting regions at other positions of the light emitting substrate are the third light emitting regions 13. Of course, the embodiment of the present disclosure is not limited to this case. In the case where the light emitting unit is located at the upper right corner of the light emitting region, the second light emitting regions can be the leftmost column of light emitting regions of the light emitting substrate, and the first light emitting region can be the lowermost row of light emitting regions of the light emitting substrate.

For example, as shown in FIG. 4, in the case where the rightmost column of light emitting regions of the light emitting substrate are the second light emitting regions 12 and the lowermost row of light emitting regions are the first light emitting regions 11, the splicing seams described above are located at the right and lower sides of the light emitting substrate, so as to be respectively combined with a row of the first light emitting regions and a column of the second light emitting regions to form display effect similar to a row of the third light emitting regions and a column of the third light emitting regions. The splicing seam between adjacent display panels is adjacent to the first light emitting region (or second light emitting region) of one display panel and adjacent to the third light emitting region of the other display panel, which is equivalent to that the splicing seam is located in the light emitting region of one display panel, thus realizing the seamless splicing display effect. The embodiment of the present disclosure does not limit which light emitting region of the display panel the splicing seam is equivalent to being located in, as long as the splicing seam is adjacent to the first light emitting region or the second light emitting region of the display panel to achieve the seamless splicing effect.

Figure 7:
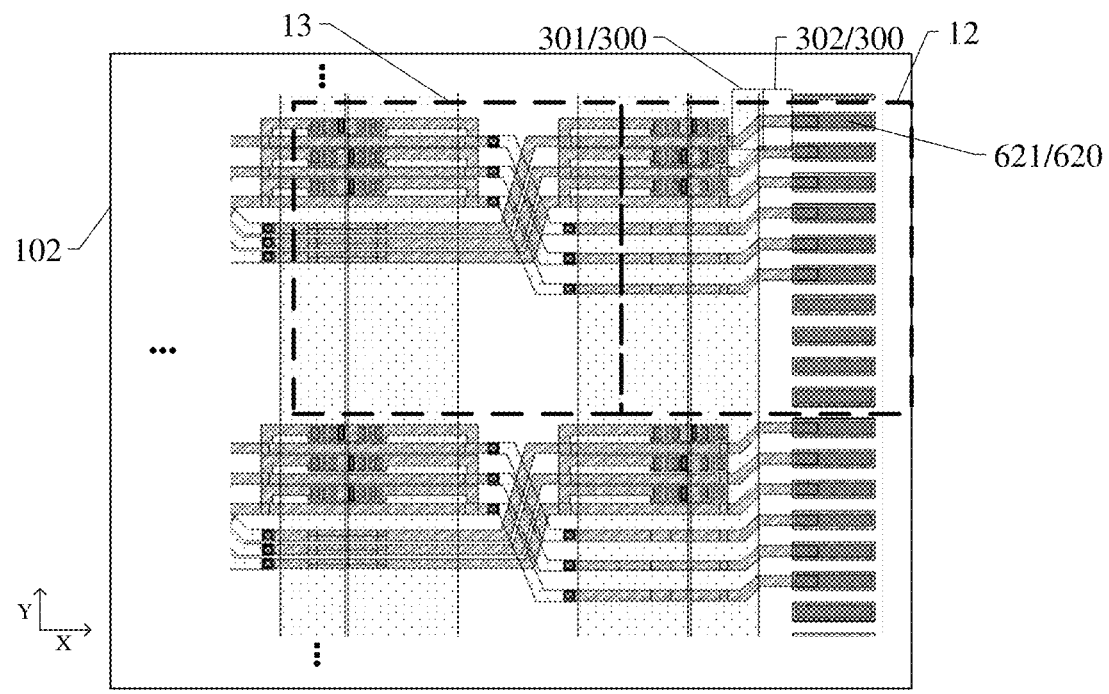

For example, as shown in FIGS. 6-7, part of the first light emitting regions 11 include the first bonding region 610, and part of the second light emitting regions 12 include the second bonding region 620. That is, the first bonding region 610 can be located in the middle of the first edge and the second bonding region 620 can be located in the middle of the second edge. The display effect of the region formed by the light emitting units located at the edge of the light emitting substrate, the bonding region and the splicing seam at the outer side of the edge of the light emitting substrate is similar to the display effect of the third light emitting regions located in the intermediate region of the light emitting substrate, thus realizing the seamless splicing effect.

For example, the size of the light emitting diode chip shown in FIG. 4 can be 1.6 inches, and the size of the display panel including the light emitting diode chip can be 7.1 inches. A large-size display device having a size of 145-inch or even a large-size display device having a size of 289-inch can be obtained by splicing a plurality of the display panels described above. The embodiment of the present disclosure is not limited to the case that the display panels are spliced into the display devices with the above sizes, and on the basis of circuit driving capability and maximizing production efficiency, display panels of different sizes can be designed to splice ultra-high definition display products of different sizes.

For example, as shown in FIGS. 4-6, the first bonding region 610 is located in a row of first light emitting regions 11, and the second bonding region 620 is located in a column of second light emitting regions 12. In the first light emitting region 11, the first bonding region 610 is located at one side of each light emitting unit 200 away from the first side 01 of the first light emitting region 11; and in the second light emitting region 12, the second bonding region 620 is located at one side of each light emitting unit 200 away from the second side 02 of the second light emitting region 12. In the embodiment of the present disclosure, the light emitting unit is arranged at an included angle position of the light emitting region, and the spare space in the light emitting region can be used for setting a bonding region to bond the FPC onto the front of the light emitting substrate, thereby realizing a narrow frame.

Figure 8:
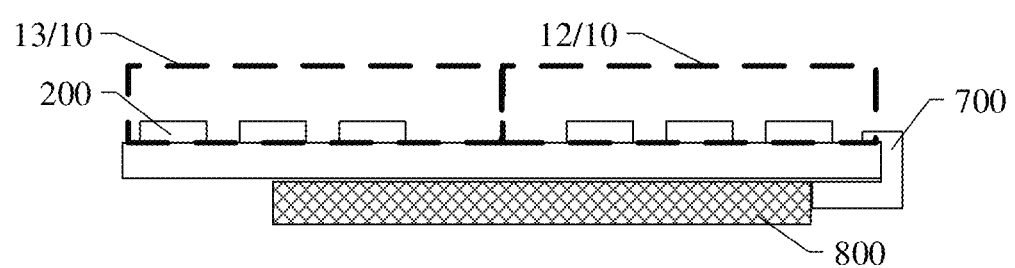
FIG. 8 is a partial cross-sectional view of bonding the light emitting substrate shown in FIG. 4 to a driving substrate.

FIG. 8 is a partial cross-sectional view of bonding the light emitting substrate shown in FIG. 4 to a driving substrate. As shown in FIG. 8, one end of the flexible printed circuit board 700 is located in the second bonding region of the second light emitting region 12, the other end of the flexible printed circuit board 700 is bent to the back of the light emitting substrate and bonded to the driving substrate 800 located on the back of the light emitting substrate, and the bending part of the flexible printed circuit board 700 is located in the splicing seam.

For example, as shown in FIGS. 5-7, in the second electrode wire 400 connected with the light emitting unit 200 in the second light emitting region 12 where the second bonding region 620 is located, the fourth wire 420 is located at one side of the third wire 410 away from the second bonding region 620. Because the width of the fourth wire 420 is greater than the width of the third wire 410 in the first direction, arranging the fourth wire 420 at the side of the third wire 410 away from the second bonding region 620 can not only meet the width requirements of the third wire 410 and the fourth wire 420, but also avoid the overlapping between the second electrode wire 400 and the electrodes of the second bonding region 620 in the direction perpendicular to the base substrate 100, so that enough space is reserved for the second bonding region, and further narrow frame can be realized.

For example, as shown in FIGS. 5-7, in the second electrode wire 400 connected with the light emitting units 200 in the light emitting regions 10 other than the second light emitting region 12 where the second bonding region 620 is located, the third wire 410 can be located at one side of the fourth wire 420 close to the second bonding region 620, and can also be located at one side of the fourth wire 420 away from the second bonding region 620, which is not limited in the embodiment of the present disclosure.

For example, as shown in FIG. 7, the second bonding region 620 includes a column of second electrode strips 621 extending in the second direction, and in the second light emitting region 12 where the second bonding region 620 is located, a part of the first electrode wire 302 located between the second electrode wire 400 and the second electrode strip 621 extends in the first direction.

For example, as shown in FIG. 7, the number of the second electrode strips 621 is greater than the number of the first electrode wires 300. Therefore, the second electrode strips can include bonding electrode strips which are bonded to the first electrode wires and dummy electrode strips which are floated, and adjacent dummy electrode strips, adjacent bonding electrode strips, and dummy electrode strips and bonding electrode strips which are adjacent to each other can be arranged substantially uniformly at equal intervals. For example, the dummy electrode strips can be used for testing electrical properties and other characteristics, and can also be used as backup electrode strips to be bonded with the first electrode wires.

In the embodiment of the present disclosure, the number of the second electrode strips is greater than the number of the first electrode wires, and the size of the second bonding region in the second direction is relatively large, so that it is convenient for the first electrode wires to be electrically connected with the second electrode strips directly in the extending direction, which can prevent the first electrode wires from forming a fan-shaped wiring region, save the space for setting the fan-shaped wiring region, help to realize a narrow frame, and help to reduce the spacing between light emitting units.

For example, as shown in FIGS. 4-7, because the second bonding region 620 does not extend to the lower right corner of the light emitting substrate, the first electrode wire 300 connected with the last row of light emitting units 200 is arranged at one side of the light emitting units 200 away from the first bonding region 610, so as to further ensure that a part of the first electrode wire 300 connected with the last row of light emitting units 200 close to the second bonding region 620 can extend to the second electrode strip 621 in the second bonding region 620 in the first direction to realize the bonding of the second electrode strip 621, and simultaneously, it can also avoid the formation of fan-shaped wiring area by the first electrode wire, which is beneficial to the realization of narrow frame.

For example, as shown in FIG. 4 and FIG. 7, because the second bonding region 620 is located in the middle of the second edge of the light emitting substrate, the first electrode wire 300 includes a part 301 extending in a direction intersected with the first direction before being connected with the second electrode strip 621. For example, part of the first electrode wire 301 connected with the last row of light emitting units will extend to the upper right, so as to realize connection with the second electrode strip 621 and simultaneously to prevent the first electrode wires from forming a fan-shaped wiring region; part of the first electrode wire 301 connected with the first row of light emitting units will extend to the lower right, so as to realize connection with the second electrode strip 621 and simultaneously to prevent the first electrode wires from forming a fan-shaped wiring region, which is beneficial to realize a narrow frame.

For example, as shown in FIG. 4 and FIG. 6, because the first bonding region 610 is located in the middle of the first edge of the light emitting substrate, the second electrode wire 400 includes a part 401 extending in a direction intersected with the second direction before being connected with the first electrode strip 611. For example, part of the second electrode wire 401 connected with the last column of light emitting units will extend to the lower left, so as to realize connection with the first electrode strip 611 and simultaneously to prevent the second electrode wires from forming a fan-shaped wiring region, which is beneficial to realize a narrow frame; part of the second electrode wire 401 connected with the first column of light emitting units will extend to the lower right, so as to realize the connection with the first electrode strip 611 and simultaneously to prevent the second electrode wires from forming a fan-shaped wiring region, which is beneficial to realize a narrow frame.

For example, as shown in FIG. 7, the number of the second electrode strips 621 arranged in the second direction is greater than the number of the first electrode wires 300 extending to the second bonding region 620, which can realize a uniform distribution of electrodes and simultaneously prevent the first electrode wires from forming a fan-shaped wiring region, thus being beneficial to realize a narrow frame.

For example, as shown in FIG. 6, the number of the first electrode strips 611 arranged in the first direction is greater than the number of the second electrode wires 400 extending to the first bonding region 610. For example, the first electrode strips also include bonding electrode strips which are bonded to the second electrode wires and dummy electrode strips which are floated, and adjacent dummy electrode strips, adjacent bonding electrode strips and dummy electrode strips and bonding electrode strips adjacent to each other can be arranged substantially uniformly at equal intervals. For example, the dummy electrode strips can be used for testing electrical properties and other characteristics, and can also be used as backup electrode strips to be bonded with the second electrode wires.

In the embodiment of the present disclosure, the number of the first electrode strips is greater than the number of the second electrode wires, and the size of the first bonding region in the first direction is relatively large, so that it is convenient for the second electrode wires to be electrically connected with the first electrode strips directly in the extending direction, which can prevent the second electrode wires from forming a fan-shaped wiring region, save the space for setting the fan-shaped wiring region, beneficial to realize a narrow frame, and beneficial to reduce the spacing between light emitting units.

For example, as shown in FIG. 7, in the case where each light emitting unit includes three light emitting sub-units, the number of first electrode wires connected with one row of light emitting units is six. In the second light emitting region, the distance between adjacent ones of the three first electrode wires not passing through the light emitting unit regions can be set to be the same as the distance between adjacent ones of the three first electrode wires passing through the light emitting unit regions, so as to ensure that the first electrode wires do not form a fan-shaped wiring region and simultaneously realize a uniform distribution of electrodes in the second bonding region.

For example, as shown in FIG. 7, in the light emitting regions other than the second light emitting region, the distance between adjacent ones of the three first electrode wires not passing through the light emitting unit regions can be less than the distance between adjacent ones of the three first electrode wires passing through the light emitting unit regions, so as to avoid short circuits among the first electrode wires arranged in the first direction and reserve redundant design space for subsequent design of other electronic elements. In addition, in the above case, by compressing the distance between adjacent ones of the first electrode wires at the outer side of the light emitting unit region, more space can be reserved for increasing the width of the first electrode wire at the outer side of the light emitting unit region, so as to reduce power consumption. Of course, the embodiment of the present disclosure is not limited to this case. In the light emitting regions other than the second light emitting region, the distance between adjacent ones of the three first electrode wires not passing through the light emitting unit regions can be equal to or greater than the distance between adjacent ones of the three first electrode wires passing through the light emitting unit regions.

The light emitting substrate shown in FIGS. 1-8 can be a display panel, the light emitting unit is a pixel unit, and the light emitting sub-unit included in the light emitting unit is a sub-pixel. The display panel provided by the embodiment of the present disclosure can realize a fine display effect by reducing the size of the light emitting unit, and can also realize a narrow frame. In the case where the display panel is used for splicing to form a large-size display device, a seamless splicing display effect can also be realized.

Of course, the light emitting substrate provided by the embodiment of the present disclosure can also serve as a backlight source to be combined with a liquid crystal display panel, without being limited in the embodiment of the present disclosure.

Another embodiment of the present disclosure provides a display device, which includes a plurality of display panels described above. The display device provided by the embodiment of the present disclosure can realize a fine display effect by reducing the size of the light emitting unit, and can also realize a narrow frame. The large-size display device including the plurality of display panels can also realize a seamless splicing display effect.

Figure 9:
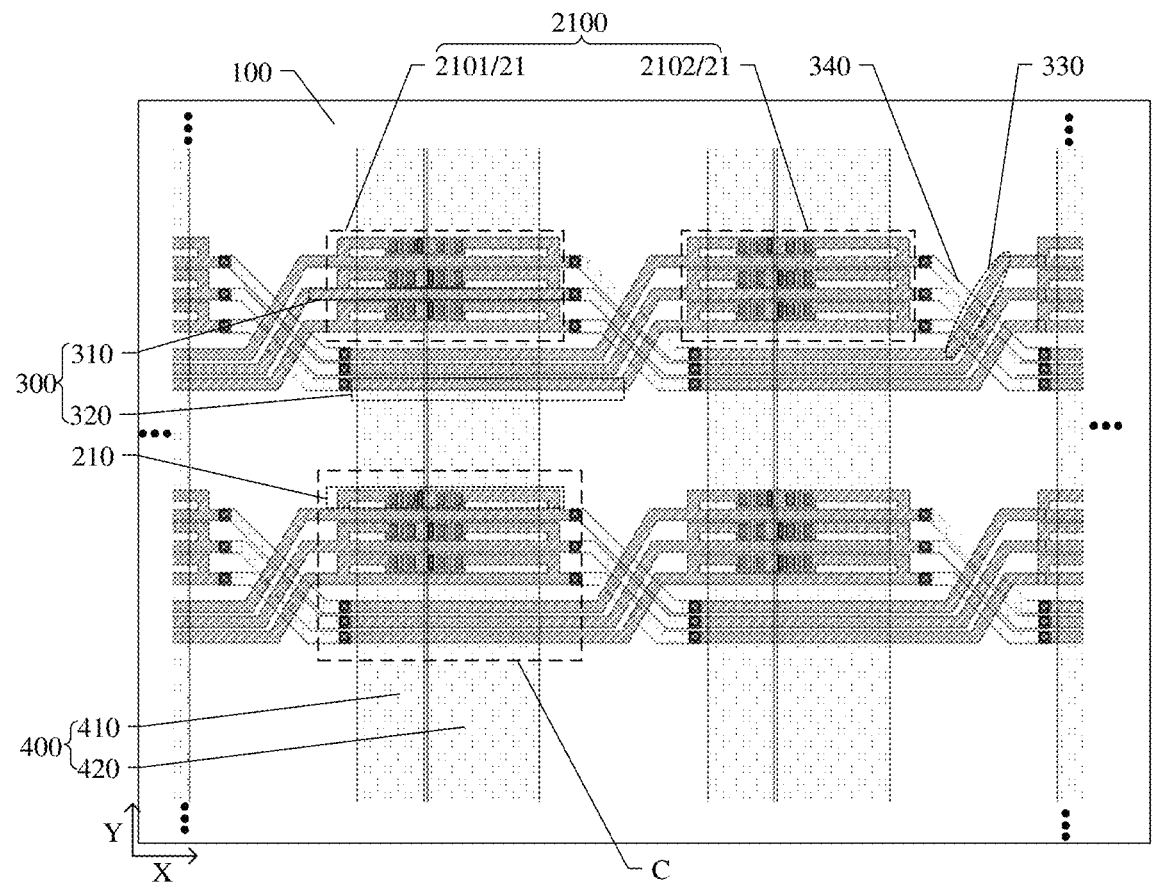
FIG. 9 is a schematic diagram of a partial planar structure of a wiring substrate provided by an embodiment of the present disclosure.
Figure 10:
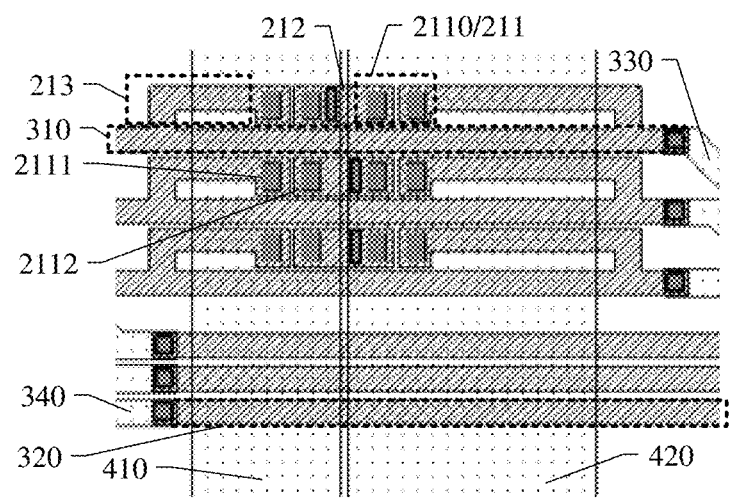
FIG. 10 is an enlarged view of part C shown in FIG. 9.

FIG. 9 is a schematic diagram of a partial planar structure of a wiring substrate provided by an embodiment of the present disclosure, and FIG. 10 is an enlarged view of part C shown in FIG. 9. As shown in FIGS. 9-10, the wiring substrate includes a base substrate 100, and a plurality of connection line unit groups 2100 and a first electrode wire 300 located on the base substrate 100. The plurality of connection line unit groups 2100 are arrayed on the base substrate 100 in a first direction and a second direction, and FIG. 9 is illustrated by taking that the X direction is the first direction and the Y direction is the second direction as an example.

As shown in FIGS. 9-10, each connection line unit group 2100 is located in a connection line region 21. The first electrode wire 300 includes a first wire 310 and a second wire 320, both of which extend in a first direction. The connection line unit groups 2100 arranged in the first direction includes a plurality of first connection line unit groups 2101 and a plurality of second connection line unit groups 2102, each first connection line unit group 2101 is connected with a corresponding first wire 310, each second connection line unit group 2102 is connected with a corresponding second wire 320, and only the first electrode wire 300 connected with a connection line unit group 2100 passes through a connection line region 21 where the connection line unit group 2100 is located.

For example, the first wire 310 connected with a first connection line unit group 2101 passes through a connection line region 21 where the first connection line unit group 2101 is located, i.e., a first connection line region, and the second wire 320 not connected with the first connection line unit group 2101 is located at the outer side of the first connection line region. Similarly, the second wire 320 connected with the second connection line unit group 2102 passes through a connection line region 21 where the second connection line unit group 2102 is located, i.e., the second connection line region, and the first wire 310 not connected with the second connection line unit group 2102 is located at the outer side of the second connection line region.

For example, as shown in FIGS. 9-10, in connection line unit groups 2100 arranged in the first direction, the first connection line unit groups 2101 and the second connection line unit groups 2102 are alternately arranged, and among the connection line unit groups 2100 located in the same row and the first electrode wire 300 connected with t the connection line unit groups 2100 located in the same row, an arrangement sequence from the first connection line unit group 2101 to the second wire 320 is the same as an arrangement sequence from the second connection line unit group 2102 to the first wire 310 in the second direction.

In the embodiment of the present disclosure, in the case where the first electrode wire connected with one row of connection line unit groups include the first wire and the second wire, only the first electrode wire connected with a connection line unit group passes through a connection line region where the connection line unit group is located, while the second electrode wire not connected with the connection line unit group is arranged at the outer side of the connection line unit group, so that the size of the connection line unit group can be designed to be relatively small to realize high-density display or high-contrast display.

For example, as shown in FIG. 9, taking the first connection line unit group 2101 and the second connection line unit group 2102 which are arranged in the first direction and are adjacent to each other as an example, and taking the positive Y direction (the direction indicated by the arrow) as an example, the first wire 310 connected with the first connection line unit group 2101 can be located at a lower side of the connection line region 21 where the second connection line unit group 2102 is located, and the second wire 320 connected with the second connection line unit group 2102 can also be located at a lower side of the connection line region 21 where the first connection line unit group 2101 is located, so that the distance between adjacent connection line unit groups arranged in the second direction can be reduced, so as to reduce the size of the connection line unit group. The embodiment of the present disclosure is described by taking that the relative positional relationship between the first connection line region and the second connection line unit group is the same as the relative positional relationship between the connection line region where the second connection line unit group is located and the first connection line unit group as an example.

For example, as shown in FIGS. 9-10, the first electrode wire 300 further includes a first connection portion 330 and a second connection portion 340, and two ends of the first connection portion 330 are respectively connected with the first wire 310 passing through the connection line region 21 where the first connection line unit group 2101 is located and the first wire 310 located at the outer side of the connection line region 21 where the second connection line unit group 2102 is located; two ends of the second connection portion 340 are respectively connected with the second wire 320 passing through the connection line region 21 where the second connection line unit group 2102 is located and the second wire 320 located at the outer side of the connection line region 21 where the first connection line unit group 2101 is located. That is, the first electrode wire 300 connected with the first connection line unit group 2101 includes the first wire 310 and the first connection portion 330, and the first electrode wire 300 connected with the second connection line unit group 2102 includes the second wire 320 and the second connection portion 340.

For example, as shown in FIGS. 9-10, the first connection portion 330 and the second connection portion 340 are located between the first connection line unit group 2101 and the second connection line unit group 2102 which are adjacent to each other, and the first connection portion 330 and the second connection portion 340 are intersected with each other and insulated from each other.

For example, as shown in FIGS. 9-10, the first wire 310 and the second wire 320 are arranged in the same layer and made of the same material.

For example, as shown in FIGS. 9-10, the wiring substrate further includes a second electrode wire 400 extending in the second direction. The second electrode wire 400 is located between the first wire 310 and the base substrate 100, and between the second wire 320 and the base substrate 100, and an insulating layer is provided between the film layer where the second electrode wire 400 is located and the film layer where the first wire 310 is located. One of the first connection portion 330 and the second connection portion 340 is arranged in the same layer as the first wire 310, and the other of the first connection portion 330 and the second connection portion 340 is arranged in the same layer as the second electrode wire 400. The connection portion arranged in the same layer as the second electrode wire 400 is electrically connected with the first wire 310 or the second wire 320 through a via hole located at the outer side of the second electrode wire 400.

For example, as shown in FIGS. 9-10, one first electrode wire 300 includes a plurality of first wires 310 which are separated from each other, and the first electrode wire 300 further includes a plurality of first connection portions 330 to connect the first wires 310 that are separated from each other. A first part of the plurality of first connection portions 330 are arranged in the same layer as the first wire 310, a second part of the plurality of first connection portions 330 are arranged in the same layer as the second electrode wire 400, and the first part of the plurality of first connection portions 330 and the second part of the plurality of first connection portions 330 are alternately arranged in the first direction. Similarly, one first electrode wire 300 includes a plurality of second wires 320 which are separated from each other, and the first electrode wire 300 also includes a plurality of second connection portions 340 to connect the second wires 320 that are separated from each other. A first part of the plurality of second connection portions 340 are arranged in the same layer as the second wire 320, a second part of the plurality of second connection portions 340 are arranged in the same layer as the second electrode wire 400, and the first part of the plurality of second connection portions 340 and the second part of the plurality of second connection portions 340 are alternately arranged in the first direction.

For example, as shown in FIGS. 9-10, the first connection portion 330 in the same layer as the first wire 310 can be integrated with the first wire 310, and two first wires 310 separated from each other are respectively connected with two ends of the first connection portion 330 in the same layer as the second electrode wire 400 through via holes included in the insulating layer. Similarly, the second connection portion 340 in the same layer as the second wire 320 can be integrated with the second wire 320, and two second wires 320 separated from each other are respectively connected with two ends of the second connection portion 340 in the same layer as the second electrode wire 400 through via holes included in the insulating layer.

In the embodiment of the present disclosure, one of the first connection portion and the second connection portion is arranged in the same layer as the first wire, and the other of the first connection portion and the second connection portion is arranged in the same layer as the second electrode wire, which can prevent the first connection portion and the second connection portion from being electrically connected, and can also avoid adding a new metal film layer to increase the thickness of the wiring substrate.

For example, as shown in FIG. 10, each connection line unit group 2100 includes a plurality of connection line units 210, each connection line unit 210 includes at least two electrical contact pairs 211, each electrical contact pair 211 includes a positive electrode contact 2111 and a negative electrode contact 2112; and in each connection line unit 210, the positive electrode contacts 2111 are electrically connected with each other, the negative electrode contacts 2112 are electrically connected with each other. The positive electrode contact 2111 and the negative electrode contact 2112 of only one electrical contact pair 211 of the at least two electrical contact pairs 211 described above are configured to be connected with the anode and the cathode of one LED chip, respectively. In the embodiment of the present disclosure, each connection line unit includes at least two electrical contact pairs, one electrical contact pair of the at least two electrical contact pairs is used for connecting the light emitting diode chip, and the other electrical contact pairs are used as backup electrical contact pairs. When the light emitting diode chip connected with one electrical contact pair therein is defective, or the electrical contact pair is broken, which causes the light emitting diode chip to fail to emit light, a light emitting diode chip can be connected with any one backup electrical contact pair so as to repair the light emitting sub-unit. The present disclosure is described by taking that the second electrode contact is the positive electrode contact and the first electrode contact is the negative electrode contact point as an example, but is not limited thereto, and they can be interchanged.

For example, as shown in FIG. 10, each connection line unit 210 further includes a positive electrode connection portion 212, the positive electrode connection portion 212 is arranged in the same layer as the first electrode wire 300, and the positive electrode contact 2111 in each connection line unit 210 is connected with the second electrode wire 400 through the positive electrode connection portion 212.

For example, as shown in FIG. 10, each connection line unit 210 further includes two negative connection portion 213 connected with each negative electrode contact 2112, the negative connection portion 213 is located at one side of the negative electrode contact 2112 away from the positive electrode contact 2111, the negative electrode contact 2112 is connected with the first electrode wire 300 through the negative connection portion 213, and the orthographic projection of at least a part of the negative connection portion 213 on the base substrate 100 is not overlapped with the orthographic projection of the second electrode wire 400 on the base substrate 100. In the embodiment of the present disclosure, by setting a negative connection portion that is not overlapped with both the second electrode wire and the first electrode wire at least partially, the negative connection portion can be cut by means of, for example, laser cutting, when the light emitting diode chip is defective, so as to disconnect the connection between the negative electrode contact and the first electrode wire and to realize repairing the light emitting sub-unit. By setting the negative connection portion, the influence of the cutting process on the second electrode wire and the first electrode wire can be avoided.

The wiring substrate shown in FIGS. 9-10 is the structure of the light emitting substrate shown in FIGS. 1-8 without the light emitting diode chip, and the specific characteristics of the wiring substrate are the same as those of the wiring substrate shown in FIGS. 1-8. Therefore, in the embodiments shown in FIGS. 9-10, the characteristics of the wiring substrate can be referred to the corresponding embodiments shown in FIGS. 1-8. The wiring substrate can be applied to a display panel, and can also applied to a backlight source, The wiring substrate provided by the embodiment of the present disclosure can realize a fine display effect by reducing the size of the line unit group, and can also realize a narrow frame.

The following statements should be noted:

(1) In the accompanying drawings of the embodiments of the present disclosure, the drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A light emitting substrate, comprising:
a base substrate;
a plurality of light emitting units, arrayed on the base substrate in a first direction and a second direction; and
first electrode wires, located on the base substrate and comprising a first wire and a second wire which extend in the first direction,
wherein the plurality of light emitting units comprise a plurality of first light emitting units and a plurality of second light emitting units, a position where each of the plurality of first light emitting units is located is one first light emitting unit region, a position where each of the plurality of second light emitting units is located is one second light emitting unit region, the first light emitting unit is connected with the first wire, the first wire passes through the first light emitting unit region and is located at an outer side of the second light emitting unit region, the second light emitting unit is connected with the second wire, and the second wire passes through the second light emitting unit region and is located at an outer side of the first light emitting unit region;
the first wire and the second wire are parts of the first electrode wires.

2. The light emitting substrate according to claim 1, wherein the first light emitting units and the second light emitting units are alternately arranged in a row of light emitting units arranged in the first direction, and among the light emitting units located in a same row and the first electrode wires connected with the light emitting units located in the same row, an arrangement sequence from the first light emitting unit to the second wire is the same as an arrangement sequence from the second light emitting unit to the first wire in the second direction.

3. The light emitting substrate according to claim 2, wherein the first electrode wires further comprise a first connection portion and a second connection portion, and two ends of the first connection portion are respectively connected with the first wire passing through the first light emitting unit region and the first wire located at the outer side of the second light emitting unit region; two ends of the second connection portion are respectively connected with the second wire passing through the second light emitting unit region and the second wire located at the outer side of the first light emitting unit region,
the first connection portion and the second connection portion are located between the first light emitting unit and the second light emitting unit which are adjacent to each other, and the first connection portion and the second connection portion are intersected with each other and insulated from each other.

4. The light emitting substrate according to claim 3, wherein the light emitting substrate comprises two first edges extending in the first direction, and in the first electrode wires connected with at least one row of light emitting units close to the first edge of the light emitting substrate, the first wire is located at a side of the second light emitting unit region away from the first edge of the light emitting substrate, and the second wire is located at a side of the first light emitting unit region away from the first edge of the light emitting substrate.

5. The light emitting substrate according to claim 4, comprising:
a plurality of light emitting regions, arrayed in the first direction and the second direction,
wherein each of the plurality of light emitting regions comprises one of the plurality of light emitting units, the light emitting unit in each of the plurality of light emitting regions is located at a position close to a corner where a first side and a second side of the each of the plurality of light emitting regions are connected with each other, and the first side and the second side of the each of the plurality of light emitting regions extend in the first direction and the second direction, respectively.

6. The light emitting substrate according to claim 5, wherein the light emitting substrate further comprises two second edges extending in the second direction, the plurality of light emitting regions comprise one row of first light emitting regions arranged in the first direction and one column of second light emitting regions arranged in the second direction, the row of first light emitting regions are located at one of the first edges of the light emitting substrate, and the column of second light emitting regions are located at one of the second edges of the light emitting substrate,
the plurality of light emitting regions further comprise a plurality of third light emitting regions; in the first direction, a size of each of the plurality of second light emitting regions is less than a size of each of the plurality of third light emitting regions; and in the second direction, a size of each of the plurality of first light emitting regions is less than a size of each of the plurality of third light emitting regions.

7. The light emitting substrate according to claim 6, further comprising:
at least one of a first bonding region and a second bonding region, located at an edge of the light emitting substrate,
wherein the first bonding region is located in the row of first light emitting regions, and the second bonding region is located in the column of second light emitting regions,
in the row of first light emitting regions, the first bonding region is located at a side of each light emitting unit away from the first side of the first light emitting region; and in the column of second light emitting regions, the second bonding region is located at a side of each light emitting unit away from the second side of the second light emitting region.

8. The light emitting substrate according to claim 7, further comprising:
a second electrode wire, extending in the second direction, the second electrode wire being located between the first wire and the base substrate,
wherein the first wire is arranged in the same layer as the second wire, one of the first connection portion and the second connection portion is arranged in the same layer as the first wire, and the other of the first connection portion and the second connection portion is arranged in the same layer as the second electrode wire.

9. The light emitting substrate according to claim 8, wherein the second electrode wire comprises a third wire and a fourth wire, each of the plurality of light emitting unit comprises three light emitting sub-units, one of the three light emitting sub-units is connected with the third wire, and the other two of the three light emitting sub-units are connected with the fourth wire, and in the first direction, a width of the fourth wire is greater than a width of the third wire.

10. The light emitting substrate according to claim 9, wherein, in the second electrode wire connected with the light emitting units in the second light emitting region where the second bonding region is located, the fourth wire is located at a side of the third wire away from the second bonding region.

11. The light emitting substrate according to claim 8, wherein the first bonding region comprises one row of first electrode strips arranged in the first direction, and a count of the first electrode strips is greater than a count of the second electrode wires; the second bonding region comprises a column of second electrode strips arranged in the second direction, and a count of the second electrode strips is greater than a count of the first electrode wires.

12. The light emitting substrate according to claim 8, wherein, in a column of the third light emitting regions located at the second edge of the light emitting substrate and arranged in the second direction, the second electrode wire comprises a third connection portion between the light emitting units and the base substrate, and the third wire and the fourth wire are both electrically connected with corresponding light emitting units through the third connection portion, and the third wire and the fourth wire are both located at a side of the light emitting units close to the second bonding region.

13. The light emitting substrate according to claim 1, wherein each of the plurality of light emitting units comprises a plurality of light emitting sub-units arranged in the second direction, and the first electrode wire arranged between adjacent light emitting sub-units in each of the plurality of light emitting units is only connected with the adjacent light emitting sub-units.

14. The light emitting substrate according to claim 13, wherein each of the plurality of light emitting sub-units comprises a connection line unit and a light emitting diode chip connected with the connection line unit, the light emitting diode chip is located at a side of the connection line unit away from the base substrate,
each connection line unit comprises at least two electrical contact pairs, each electrical contact pair comprises a first electrode contact and a second electrode contact; in each connection line unit, first electrode contacts are electrically connected with each other, second electrode contacts are electrically connected with each other, and only one electrical contact pair of the at least two electrical contact pairs is connected with the light emitting diode chip.

15. A display device, comprising the light emitting substrate according to claim 1, wherein the light emitting substrate is a display panel.

16. A wiring substrate, comprising:
a base substrate;

a plurality of connection line unit groups, arrayed on the base substrate in a first direction and a second direction; and first electrode wires, located on the base substrate and comprising a first wire and a second wire which extend in the first direction, wherein the plurality of connection line unit groups comprise first connection line unit groups and second connection line unit groups, a position where each of the first connection line unit groups is located is one first connection line region, a position where each of the second connection line unit groups is located is one second connection line region, the first connection line unit group is connected with the first wire, the first wire passes through the first connection line region and is located at an outer side of the second connection line region, the second connection line unit group is connected with the second wire, and the second wire passes through the second connection line region and is located at an outer side of the first connection line region;

the first wire and the second wire are parts of the first electrode wires.

17. The wiring substrate according to claim 16, wherein the first connection line unit groups and the second connection line unit groups are alternately arranged in a row of connection line unit groups arranged in the first direction, and among the connection line unit groups located in a same row and the first electrode wires connected with the connection line unit groups located in the same row, an arrangement sequence from the first connection line unit group to the second wire is the same as an arrangement sequence from the second connection line unit group to the first wire in the second direction.

18. The wiring substrate according to claim 17, wherein the first electrode wires further comprise a first connection portion and a second connection portion, and two ends of the first connection portion are respectively connected with the first wire passing through the first connection line region and the first wire located at the outer side of the second connection line region; two ends of the second connection portion are respectively connected with the second wire passing through the second connection line region and the second wire located at the outer side of the first connection line region, the first connection portion and the second connection portion are located between the first connection line unit group and the second connection line unit group which are adjacent to each other, and the first connection portion and the second connection portion are intersected with each other and insulated from each other.

19. The wiring substrate according to claim 18, further comprising:

a second electrode wire, extending in the second direction, the second electrode wire being located between the first wire and the base substrate, wherein the first wire is arranged in the same layer as the second wire, one of the first connection portion and the second connection portion is arranged in the same layer as the first wire, and the other of the first connection portion and the second connection portion is arranged in the same layer as the second electrode wire.

20. A light emitting substrate, comprising:

a base substrate;

a plurality of light emitting units, arrayed on the base substrate in a first direction and a second direction; and first electrode wires, located on the base substrate and comprising a first wire and a second wire which extend in the first direction, wherein the plurality of light emitting units comprise a plurality of first light emitting units and a plurality of second light emitting units, a position where each of the plurality of first light emitting units is located is one first light emitting unit region, a position where each of the plurality of second light emitting units is located is one second light emitting unit region, the first light emitting unit is connected with the first wire, the first wire passes through the first light emitting unit region and is located at an outer side of the second light emitting unit region, the second light emitting unit is connected with the second wire, and the second wire passes through the second light emitting unit region and is located at an outer side of the first light emitting unit region;

each of the plurality of light emitting units comprises a plurality of light emitting sub-units arranged in the second direction, and the first electrode wire arranged between adjacent light emitting sub-units in each of the plurality of light emitting units is only connected with the adjacent light emitting sub-units;

each of the plurality of light emitting sub-units comprises a connection line unit and a light emitting diode chip connected with the connection line unit, the light emitting diode chip is located at a side of the connection line unit away from the base substrate, each connection line unit comprises at least two electrical contact pairs, each electrical contact pair comprises a first electrode contact and a second electrode contact; in each connection line unit, first electrode contacts are electrically connected with each other, second electrode contacts are electrically connected with each other, and only one electrical contact pair of the at least two electrical contact pairs is connected with the light emitting diode chip.

* * * * *